US012772851B2

(12) United States Patent
Lee et al.

(10) Patent No.: US 12,772,851 B2
(45) Date of Patent: Oct. 20, 2026

(54) SEMICONDUCTOR PACKAGE WITH A HEAT DISSIPATION MEMBER AND A HEAT TRANSMISSION MEMBER COMPRISING PHASE CHANGE METAL PARTICLES

(71) Applicant: SAMSUNG ELECTRONICS CO., LTD., Suwon-si (KR)

(72) Inventors: Jonggyu Lee, Suwon-si (KR); Youngsuk Nam, Daejeon (KR); Seokkan Ki, Daejeon (KR); Jaechoon Kim, Suwon-si (KR); Taehwan Kim, Suwon-si (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 298 days.

(21) Appl. No.: 18/512,640

(22) Filed: Nov. 17, 2023

(65) Prior Publication Data

US 2024/0170366 A1 May 23, 2024

(30) Foreign Application Priority Data

Nov. 17, 2022 (KR) ........................ 10-2022-0154819

(51) Int. Cl.
*H10W 40/73* (2026.01)
*H10W 70/60* (2026.01)
(Continued)

(52) U.S. Cl.
CPC ........ *H10W 40/735* (2026.01); *H10W 70/611* (2026.01); *H10W 70/685* (2026.01);
(Continued)

(58) Field of Classification Search
CPC . H10W 40/735; H10W 70/611; H10W 90/00; H10W 90/724; H10W 90/734;
(Continued)

(56) References Cited

U.S. PATENT DOCUMENTS 5,378,337 A 1/1995 Kiyomura
7,332,807 B2 2/2008 Dani et al.
(Continued)

FOREIGN PATENT DOCUMENTS

KR 10-1465616 B1 11/2014

OTHER PUBLICATIONS

Kandasamy, Ravi et al., "Transient cooling of electronics using phase change material (PCM)-based heat sinks", Applied Thermal Engineering 28 (2008) 1047-1057. (11 pages total).
(Continued)

*Primary Examiner* — Khiem D Nguyen
(74) *Attorney, Agent, or Firm* — Sughrue Mion, PLLC

(57) ABSTRACT

Provided is a semiconductor package including a circuit board, a semiconductor chip on the circuit board, a heat dissipation member adjacent to the semiconductor chip, and a heat transmission member between the semiconductor chip and the heat dissipation member, the heat transmission member including a resin insulating body and phase change metal particles connected to each other in the resin insulating body, wherein the phase change metal particles connect the semiconductor chip and the heat dissipation member, the phase change metal particles being configured to transmit heat generated by the semiconductor chip to the heat dissipation member.

19 Claims, 9 Drawing Sheets

(51) Int. Cl.

| | |
|---|---|
| ***H10W 70/685*** | (2026.01) |
| ***H10W 74/15*** | (2026.01) |
| ***H10W 76/10*** | (2026.01) |
| ***H10W 90/00*** | (2026.01) |
| *H10W 74/40* | (2026.01) |

(52) U.S. Cl.

CPC ............ *H10W 90/00* (2026.01); *H10W 74/15* (2026.01); *H10W 74/40* (2026.01); *H10W 76/10* (2026.01); *H10W 90/724* (2026.01); *H10W 90/734* (2026.01)

(58) Field of Classification Search

CPC ..... H10W 76/10; H10W 74/15; H10W 40/73; H01L 23/42; H01L 23/427; H01L 23/3675

See application file for complete search history.

(56) References Cited

U.S. PATENT DOCUMENTS

| | | | | |
|---|---|---|---|---|
| 9,024,434 | B2 | 5/2015 | Im et al. | |
| 9,054,067 | B2 | 6/2015 | Im et al. | |
| 10,784,181 | B2 * | 9/2020 | Fu | H01L 21/4871 |
| 2009/0096100 | A1 * | 4/2009 | Kajiwara | H01L 23/49562 252/512 |
| 2012/0261819 | A1 * | 10/2012 | Brunschwiler | H01L 23/295 257/734 |
| 2012/0280382 | A1 * | 11/2012 | Im | H01L 23/36 257/E23.11 |
| 2015/0255441 | A1 * | 9/2015 | Lamorey | H01L 25/18 438/107 |
| 2018/0068926 | A1 | 3/2018 | Krajniak et al. | |
| 2018/0294205 | A1 * | 10/2018 | Chainer | H01L 23/427 |
| 2020/0132394 | A1 * | 4/2020 | Joshi | F28D 20/023 |
| 2020/0219789 | A1 * | 7/2020 | Uppal | H01L 23/427 |

OTHER PUBLICATIONS

Yang, Xiaowei et al., "Simulation of nanofluid-cooled lithium-ion battery during charging: A battery connected to a solar cell", International Journal of Mechanical Sciences 212 (2021) 106836. (25 pages total).

Dhir, Vijay K. et al., "Numerical Simulation of Pool Boiling: A Review", Journal of Heat Transfer, Jun. 2013, vol. 135, pp. 061502-1-061502-17.

Nazir, Hassan et al., "Recent developments in phase change materials for energy storage applications: A review", International Journal of Heat and Mass Transfer, vol. 129, 2019, pp. 491-523.

* cited by examiner

II-II'

SEMICONDUCTOR PACKAGE WITH A HEAT DISSIPATION MEMBER AND A HEAT TRANSMISSION MEMBER COMPRISING PHASE CHANGE METAL PARTICLES

CROSS-REFERENCE TO RELATED APPLICATION

This application is based on and claims priority to Korean Patent Application No. 10-2022-0154819 filed on Nov. 17, 2022, in the Korean Intellectual Property Office, the disclosure of which is incorporated herein by reference in its entirety.

BACKGROUND

Embodiments of the present disclosure relate to a semiconductor package.

Recently, a semiconductor device used in a mobile terminal has become highly integrated and multifunctional to require increased power consumption of semiconductor devices included in the mobile terminal. Accordingly, heat dissipation capability of the semiconductor device has become essential. On the other hand, there may be a space limitation for implementing heat dissipation in a highly integrated semiconductor device. Accordingly, semiconductor package technology that can efficiently perform heat dissipation functions and utilize a space suitable for a high degree of integration at the same time is required.

SUMMARY

One or more embodiments provide a semiconductor package having improved heat dissipation characteristics.

According to an aspect of an example embodiment, there is provided a semiconductor package including a circuit board, a semiconductor chip on the circuit board, a heat dissipation member adjacent to the semiconductor chip, and a heat transmission member between the semiconductor chip and the heat dissipation member, the heat transmission member including a resin insulating body and phase change metal particles connected to each other in the resin insulating body, wherein the phase change metal particles connect the semiconductor chip and the heat dissipation member, the phase change metal particles being configured to transmit heat generated by the semiconductor chip to the heat dissipation member.

According to another aspect of an example embodiment, there is provided a semiconductor package including an interposer including a first surface and a second surface opposite to the first surface, the interposer including upper connection terminals on the first surface and lower connection terminals on the second surface, a plurality of semiconductor chips on the interposer and connected to the upper connection terminals, a package substrate on which the interposer is mounted to be connected to the lower connection terminals, a heat dissipation member on the package substrate, the interposer, and the plurality of semiconductor chips, a heat transmission member between the plurality of semiconductor chips and the heat dissipation member, the heat transmission member including a resin insulating body and phase change metal particles connected to each other in the resin insulating body, wherein the phase change metal particles include first phase change metal particles in contact with a surface of the semiconductor chip and second phase change metal particles in contact with a surface of the heat dissipation member, the phase change metal particles being configured to transmit heat generated by the semiconductor chip to the heat dissipation member.

According to another aspect of an example embodiment, there is provided a semiconductor package including a circuit board, a semiconductor chip on the circuit board, and a heat dissipation member including a resin insulating body adjacent to the semiconductor chip and phase change metal particles connected to each other in the resin insulating body, wherein the phase change metal particles include first phase change metal particles in contact with a surface of the semiconductor chip and second phase change metal particles in contact with a surface of the heat dissipation member, the phase change metal particles configured to transmit heat generated by the semiconductor chip to the heat dissipation member.

BRIEF DESCRIPTION OF DRAWINGS

The above and other aspects, features, and advantages of the embodiments will be more clearly understood from the following detailed description, taken in conjunction with the accompanying drawings, in which.

DETAILED DESCRIPTION

Hereinafter, example embodiments of the present disclosure will be described with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
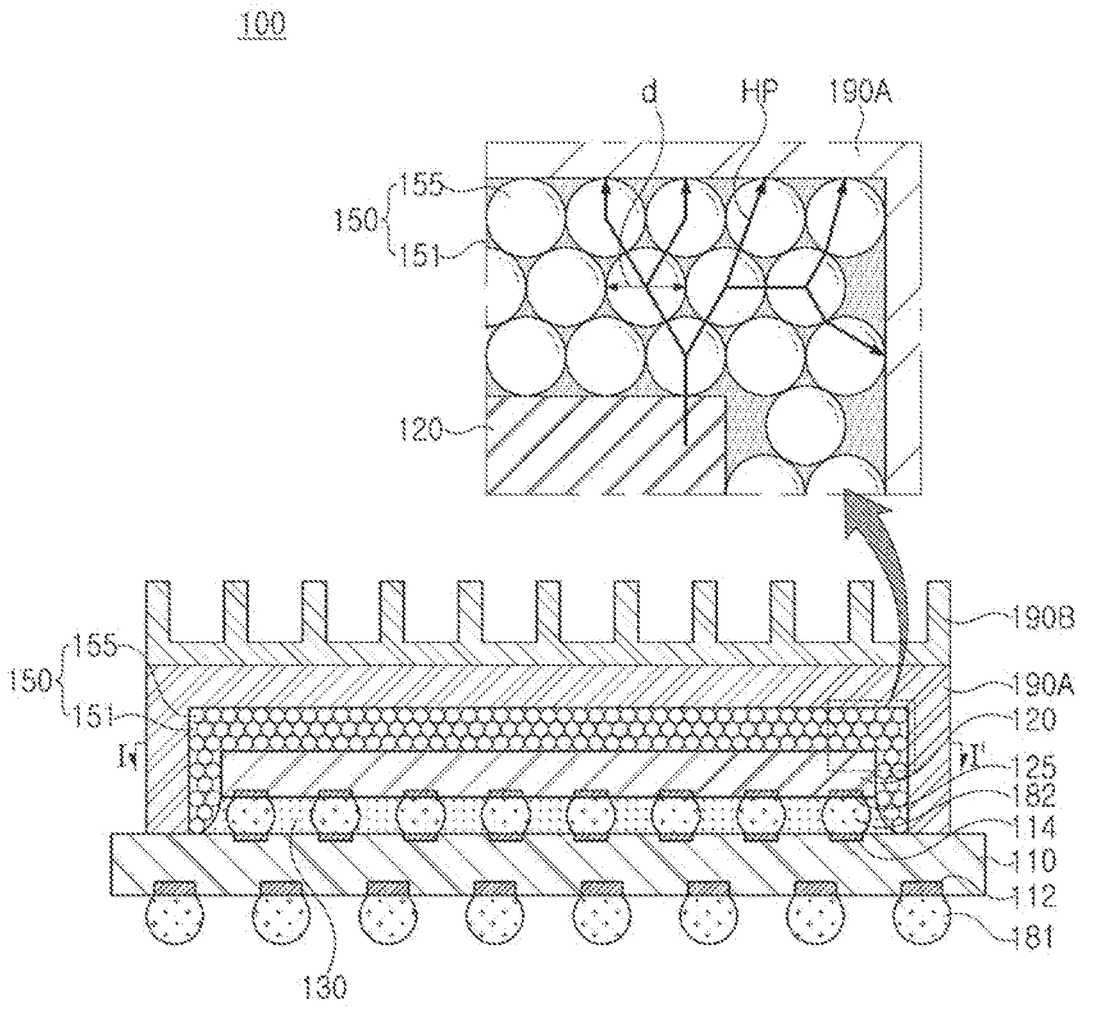
FIG. 1 is a side cross-sectional view of a semiconductor package according to an example embodiment.
Figure 2:
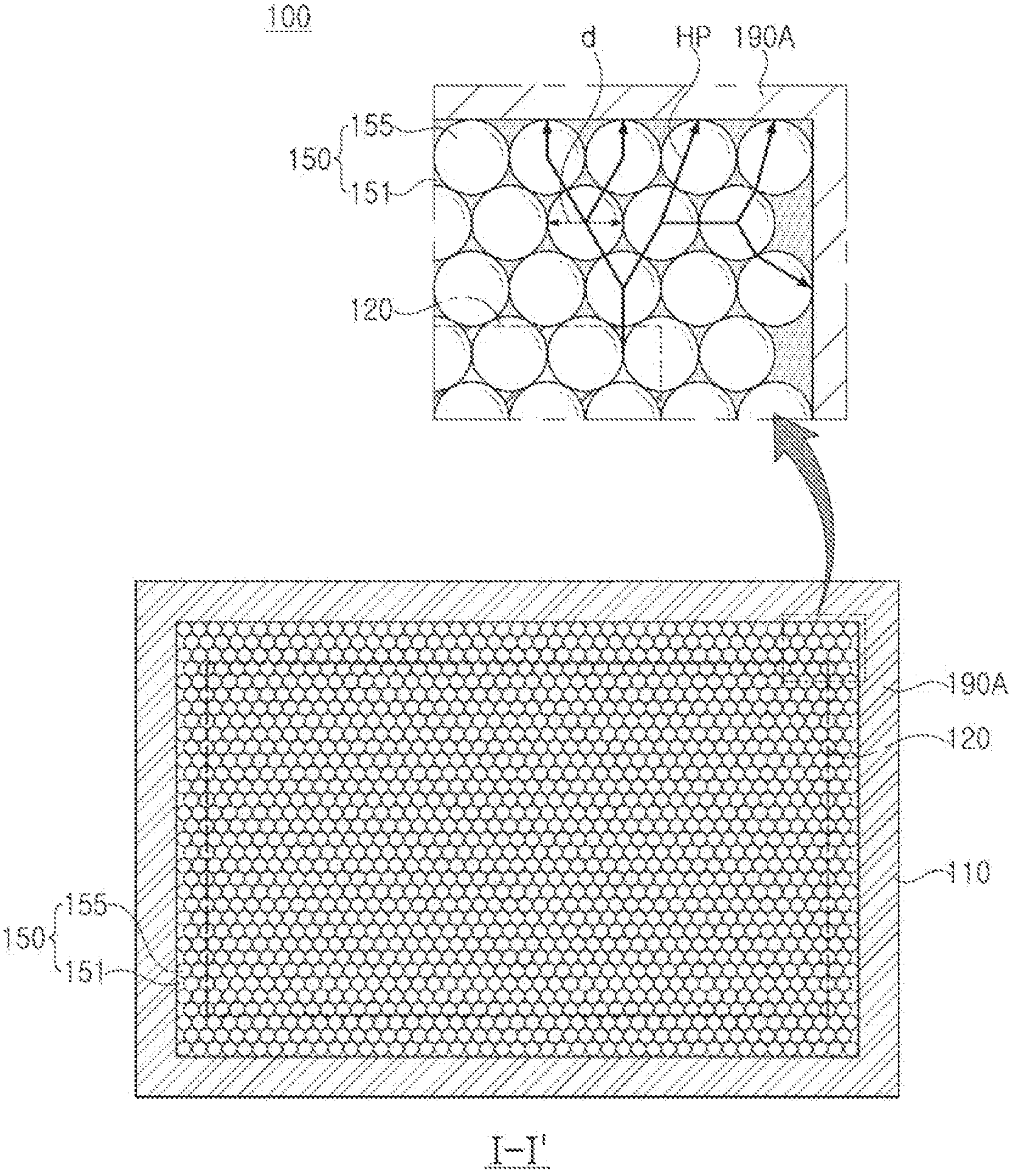
FIG. 2 is a plan view of the semiconductor package of FIG. 1 taken along line I-I'.

FIG. 1 is a side cross-sectional view of a semiconductor package according to an example embodiment, and FIG. 2 is a plan view of the semiconductor package of FIG. 1 taken along line I-I'.

Referring to FIGS. 1 and 2, a semiconductor package 100 according to an example embodiment may include a circuit board 110, a semiconductor chip 120 disposed on an upper surface of the circuit board 110, a heat transmission member 150 covering the semiconductor chip 120, and a first heat dissipation member 190A and a second heat dissipation member 190B disposed on the heat transmission member 150.

The circuit board 110 according to an example embodiment may include a wiring circuit formed in a substrate body, and a plurality of lower pads 112 disposed on a lower surface of the substrate body and a plurality of upper pads 114 disposed on an upper surface of the substrate body, respectively, and connected to the wiring circuit. In some example embodiments, the substrate body may include a resin-based insulating layer such as an epoxy resin, a Bakelite resin, or a glass epoxy. The wiring circuit may include gold (Au), silver (Ag), platinum (Pt), aluminum (Al), and copper (Cu). In other example embodiments, a base substrate 210 may be a redistribution substrate having a circuit pattern. The substrate body may include an inorganic insulating layer such as silicon oxide or silicon nitride, or a photosensitive organic insulating material such as a photo-imageable dielectric (PID).

In some example embodiments, the semiconductor chip 120 may include a logic chip or a memory chip. For example, the logic chip may include a controller or a microprocessor. For example, the memory chip may include a memory chip such as a dynamic random access memory (DRAM), a static random access memory (SRAM), a flash, a phase-change random access memory PRAM, a resistive random access memory (ReRAM), a ferroelectric random access memory (FeRAM), or an magnetoresistive random access memory (MRAM). In some example embodiments, the memory chip may be a high-band memory (HBM) chip made up of stacks of the memory chip connected to each other in a through-silicon via (TSV) structure.

In some example embodiments, the circuit board 110 may be a printed circuit board (PCB). An external connection terminal 181 may be provided on the plurality of lower pads 112 disposed on a lower surface of the circuit board 110. For example, the external connection terminal 181 may include, for example, at least one metal of tin (Sn), lead (Pb), nickel (Ni), gold (Au), silver (Ag), copper (Cu) or bismuth (Bi) or alloys thereof.

The semiconductor chip 120 may include a plurality of contact pads 125 disposed on a lower surface of the semiconductor chip 120 and connected to the upper pads 114 of the circuit board 110, respectively. The contact pads 125 of the first semiconductor chip 120 may be connected to the upper pad 112*a* of the circuit board 110 by a connection bump 182. The semiconductor package 100 further includes an underfill 130 disposed between the circuit board 110 and the semiconductor chip 120. The underfill 130 may surround a plurality of connection bumps 160 and fill a space between the circuit board 110 and the semiconductor chip 120. The underfill 130 may protect the plurality of upper pads 114, a plurality of connection bumps 182, and the contact pads 125 from the outside. For example, the underfill 130 may include an insulating polymer material such as an epoxy resin.

The heat dissipation member according to an example embodiment may include a first heat dissipation member 190A disposed on the circuit board 110 and having a cap structure configured to cover the semiconductor chip 120, and a second heat dissipation member 190B, such as a heat sink, disposed on an upper surface of the first heat dissipation member 190A, but embodiments are not limited thereto. In some example embodiments, only one of the first and second heat dissipation members 190A and 190B may be provided. For example, the first and second heat dissipation members 190A and 190B may include a material having high thermal conductivity (e.g., a metal such as copper). A thermal interface material (TIM) may be disposed between the first and second heat dissipation members 190A and 190B. The TIM may enhance physical and thermal coupling between the first and second heat dissipation members 190A and 190B.

In an example embodiment, the heat transmission member 150 may be disposed in a space between the first heat dissipation member 190A and the semiconductor chip 120 to enhance thermal coupling between the first heat dissipation member 190A and the semiconductor chip 120. The heat transmission member 150 may be disposed to cover the semiconductor chip 120, and may surround an upper surface and a side surface of the semiconductor chip 120. The first heat dissipation member 190A may be disposed to surround an upper surface and a side surface of the heat transmission member 150.

The heat transmission member 150 according to the example embodiment may include a resin insulating body 151 and phase change metal particles 155 disposed in the resin insulating body 151.

The phase change metal particles 155 include a metal-based phase change material (PCM) and have a melting point at a temperature higher than room temperature. For example, a melting point of the phase change metal particles 155 may be 20° C. or higher, particularly, 25° C. or higher. In some example embodiments, the melting point of the phase change metal particles 155 may range from 20° C. to 80° C.

The phase change metal particles 155 may have relatively higher thermal conductivity than other phase change materials (e.g., an organic base). For example, the thermal conductivity of the phase change metal particles 150 may be greater than or equal to 20 W/m·K (e.g., about 30 W/m·K). For example, the phase change metal particles 155 may include a single metal or an alloy such as gallium (Ga). The alloy may include an alloy of indium (In), bismuth (Bi) and tin (Sn), mixed to have an appropriate melting point and thermal conductivity.

The metal-based phase change metal materials may be provided in the form of particles to increase a surface area thereof. The increase in the surface area may increase the probability of nuclear formation and contribute to resolution of a supercooling phenomenon. For example, the phase change metal particles 155 may have a spherical shape. The phase change metal particles 155 may have a similar spherical shape such as an oval shape even if they are not completely spherical. For example, the phase change metal particles 155 may have a diameter d that is greater than or equal to 0.1 mm. In some example embodiments, the diameter d of the phase change metal particles 155 may range from 0.1 mm to 5 mm. In this example embodiment, the phase change metal particles 155 are illustrated in a form having substantially the same diameter d, but embodiments are not limited thereto (see FIGS. 7 and 8).

The phase change metal particles 155 in the resin insulating body 151 may form a connection structure in which they are connected to each other. According to an example embodiment, the phase change metal particles 155 may be arranged to be in direct contact with surfaces of other adjacent phase change metal particles 155. According to an example embodiment, the connection structure may be in contact with a surface of the semiconductor chip 120 and an internal surface of the first heat dissipation member 190A, respectively. Through the contacts of the phase change metal particles 155, the connection structure of the phase change metal particles 155 may form a heat transmission path HP to transfer heat generated by the semiconductor chip 120 to the first heat dissipation member 190A. For example, the phase change metal particles 155 connected to each other may transfer heat generated by the semiconductor chip 120 to the first heat dissipation member 190A.

The heat transmission performed in the heat transmission path may be performed in a process of changing the phase change metal particles 155 into a solid phase S and a liquid phase L.

Figure 3:
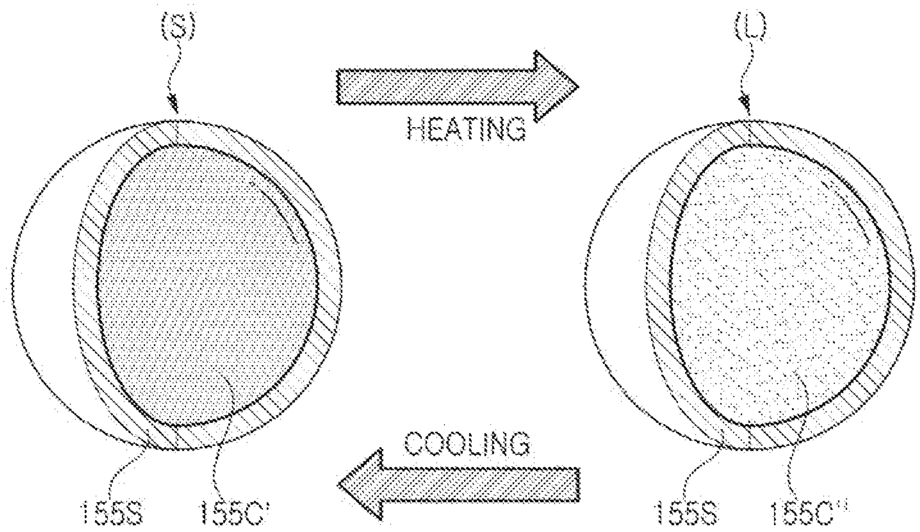
FIG. 3 is a schematic view illustrating a phase change process of a metal-based phase change material according to an example embodiment.

For example, referring to FIG. 3, a phase change process of the phase change metal particles 155 according to an example embodiment is illustrated. The phase change metal particles 155 may include a shell 155 surrounding spherical metal cores 155C' and 155C". When the phase change metal particles 155 absorb and heat the heat generated by semiconductor chip 120, a solid metal core 155C' may be phase-changed into a liquid metal core 155C". Since the phase change metal particles 155 according to this example embodiment have a relatively low melting point (e.g., 20° C. to 80° C.), the phase change may be performed by the heat generated by the semiconductor chip 120. The phase change metal particles 155 changed to the liquid phase L may be cooled by dissipating the heat through the metal particles 155 which are other adjacent solid phases S, or the first heat dissipation member 190A, and may be reversibly changed to the solid metal core 155". Through the phase change process, the heat generated by the semiconductor chip 120, which is a heat source, may be more effectively transmitted to the first heat dissipation member 190A.

Furthermore, since the phase change metal particles 155 according to an example embodiment are arranged to be in contact with each other, and the heat may be transmitted through the contact with the phase change metal particles 155, nuclei can be formed in portions of the liquid phase (L) metal particles 155 in contact with the solid phase (S) metal particles 155, thus preventing overcooling. For example, the phase change metal particles 155 disposed far away from the semiconductor chip 120 may be maintained in the solid phase (S) by coming into contact with the first heat dissipation member 190A, and accordingly, stable propagation of crystallization may be expected during the heat transmission process. This will be described in detail with reference to FIG. 5.

In the example embodiment, the shell 155S of the phase change metal particle may include an oxide film or a polymer. For example, the oxide film may be a natural oxide film generated in a process of providing the phase change metal particles into the resin insulating body. In some example embodiments, the phase change metal particles 155' may be manufactured in advance and then coated with an appropriate polymer. For example, a polymer shell may include polyvinylidene fluoride (PVDF).

In the connection structure of the phase change metal particles 155 according to an example embodiment of, one phase change metal particle 155 may be in direct contact with surfaces of two or more phase change metal particles 155. As illustrated in enlarged views of FIGS. 1 and 2, the phase change metal particles 155 may have a hexagonal close packed arrangement. The phase change metal particles 155 may constitute a three-dimensional connection structure stacked in two or more layers. For example, one phase change metal particle 155 may be in direct contact with surfaces of at most 12 phase change metal particles. In the arrangement, a heat transmission path HP provided by the phase change metal particles 155 may form a complex network. Through such a heat transmission network, more effective heat dispersion may be achieved, and heat transmission efficiency may be improved, thereby significantly reducing the supercooling phenomenon.

In an example embodiment, although the phase change metal particles 155 illustrate an ideal connection structure having a hexagonal dense arrangement. However, although some phase change metal particles may be missed, or defects that are not in contact with adjacent phase change metal particles may occur, a considerable number of other phase change metal particles are in direct contact with each other. Accordingly, a more effective heat dissipation without the supercooling may be expected through the heat transmission network described above.

The resin insulating body 151 may prevent an undesired short circuit caused by the phase change metal particles 155. The resin insulating body 151 may include a curable resin having electrical insulation but relatively excellent thermal conductivity. For example, the resin insulating body 151 may include polydimethylsiloxane (PDMS), polyimide (PI), polyethylene terephthalate (PET), polyethersulfone (PES), polyethylene naphthalate (PEN), polyaniline (PA), an epoxy resin, or an acrylic resin. In some example embodiments, the phase change metal particles 155 may range from 50% to 90%, relative to the total volume of the heat transmission member 150.

Figure 4:
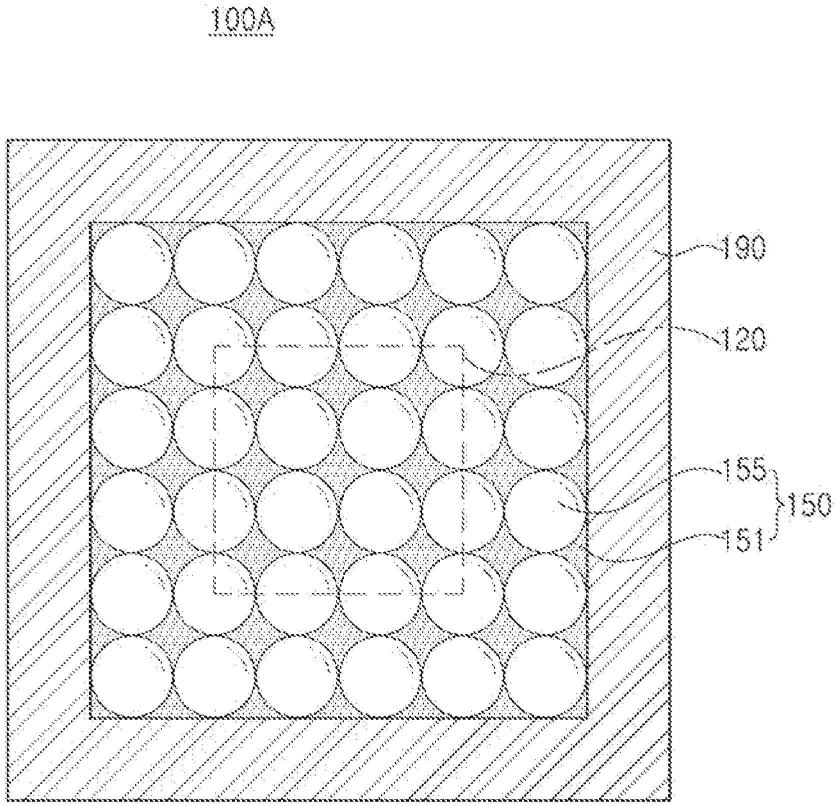
FIG. 4 is a plan view of a semiconductor package according to an example embodiment, which illustrates an example of a metal-based phase change material arrangement.

FIG. 4 is a plan view of a semiconductor package according to an example embodiment, which illustrates an example of a metal-based phase change material arrangement.

Referring to FIG. 4, a semiconductor package 100A according to an example embodiment may be understood as being similar to the semiconductor package 100 illustrated in FIGS. 1 to 3, except that the phase change metal particles 155 have a two-dimensional connection structure in the resin insulating body 151. The description of the components of this example embodiment may refer to the description of the same or similar components of the semiconductor package 100 illustrated in FIGS. 1 to 3 unless described otherwise.

The heat transmission member 150 according to this example embodiment may include the resin insulating body 151 and the phase change metal particles 155 arranged in two dimensions (or planes) in the resin insulating body 151. In some example embodiments, the phase change metal particles 155 may include a single metal such as gallium (Ga), or alloys of indium (In), bismuth (Bi) and tin (Sn). The resin insulating body 151 may be a curable polymer with relatively excellent thermal conductivity, such as polydimethylsiloxane (PDMS).

Each of the phase change metal particles 155 according to this example embodiment has a substantially identical spherical shape, and are arranged in a lattice structure so that the adjacent phase change metal particles 155 are in contact with each other, thereby forming a connection structure in the resin insulating body 151. The connection structure in the resin insulating body 151 may be in contact with a surface of a semiconductor chip 120 and an internal surface of a heat dissipation member 190, respectively.

Figure 5:
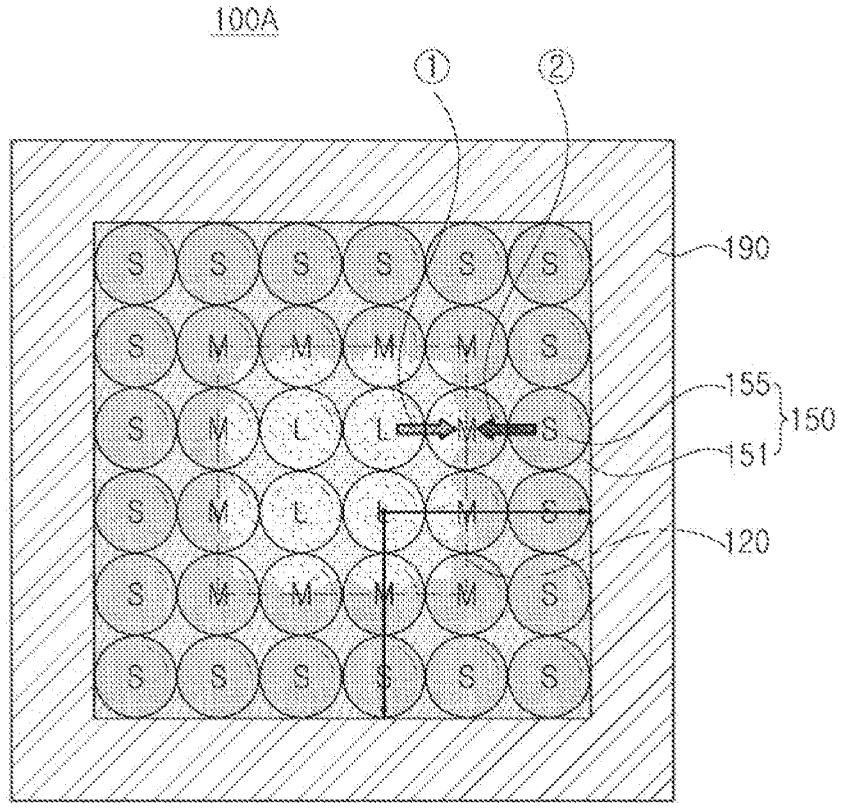
FIG. 5 is a view illustrating a heat transmission process in the arrangement of the metal-based phase change materials of FIG. 4.

For example, referring to FIG. 5, phase change metal particles L of a first group may be in contact with the semiconductor chip 120 on an upper surface of the semiconductor chip 120, and phase change metal particles S of a second group may be in contact with the heat dissipation member 190 at the edge of the connection structure. Phase change metal particles M of a third group may provide a heat transmission network by connecting the phase change metal particles L and S of the first and second groups to each other.

The phase change metal particles L of the first group may be phase-changed into a liquid metal by absorbing the heat generated by the semiconductor chip 120 (see arrow "①"). The phase change metal particles S of the third group disclosed far away from the semiconductor chip 120 which is a heat generation source may be maintained as a solid metal by coming into contact with the heat dissipation member 190. As illustrated in FIG. 5, the phase change metal particles M of the third group may be disposed between the phase change metal particles L and S of the first and second groups, and may be in a partially phase change state. Nuclear formation may be performed at a portion in contact with the phase change metal particles S of the third group to change partially change the phase change metal particles S to a solid phase (see arrow "②"), and when reducing the heat dissipation, the phase change metal particles L of the first group may be induced to nuclear formation and be changed to the solid phase.

In this manner, the phase change metal particles 155 may change a phase from solid to liquid in a direction of gradually spreading from a central region adjacent to the semiconductor chip 120 to a peripheral region thereof.

In rapid heat dissipation conditions, a phase change of phase change metal particles 155 may occurs within a short period of time, thus preventing a rapid increase in a temperature of the semiconductor chip 120. With an increase in a heat dissipation amount, additional heat may be transmitted through the contact with the phase change metal particles 155, and the phase change metal particles 155 may be changed to the liquid phase over a larger area than the central region illustrated in FIG. 5, and the heat may be transmitted to the heat dissipation member 190 and then emitted.

Furthermore, when the heat dissipation amount is reduced after performing the heat transmission through the contact with the phase change metal particles 155, the nuclear formation may be induced from the portion in contact with the phase change metal particles 155, and the phase change metal particles 155 may be gradually changed back to the solid phase as they approach the central region. In this manner, a more stable propagation of crystallization may be expected by more effectively preventing the supercooling phenomenon through the contact between the phase change metal particles 155 in the resin insulating body 151.

In order to confirm heat dissipation performance (e.g., temperature management performance of a heating element over time) with the introduction of the heat transmission member according to an example embodiment, the following experiment was conducted.

First, heat transmission members A1, A2 and A3 according to this example embodiment was formed to cover the same heating element. The heat transmission members may be configured to include 50μℓ of gallium particles in a PDMS resin body. Here, as described above, the gallium particles are arranged to be in contact with each other to form a connection structure, and the connection structure may be in contact with the heating element. Alternatively, members B1, B2 and B3 formed of only the PDMS resin body without the gallium particles were formed to cover the same heating element.

A temperature increase of the heating element was measured by changing a condition of the heating element. For example, a heat dissipation amount was changed to 20 W/cm$^2$, 35 W/cm$^2$, and 60 W/cm$^2$, respectively, to measure the time at which the heating element reached a temperature of 70° C. and the time at which the heating element reached a temperature of 100° C. When desired heat dissipation is made, it may be expected that the time to reach a specific temperature increases.

Figure 6:
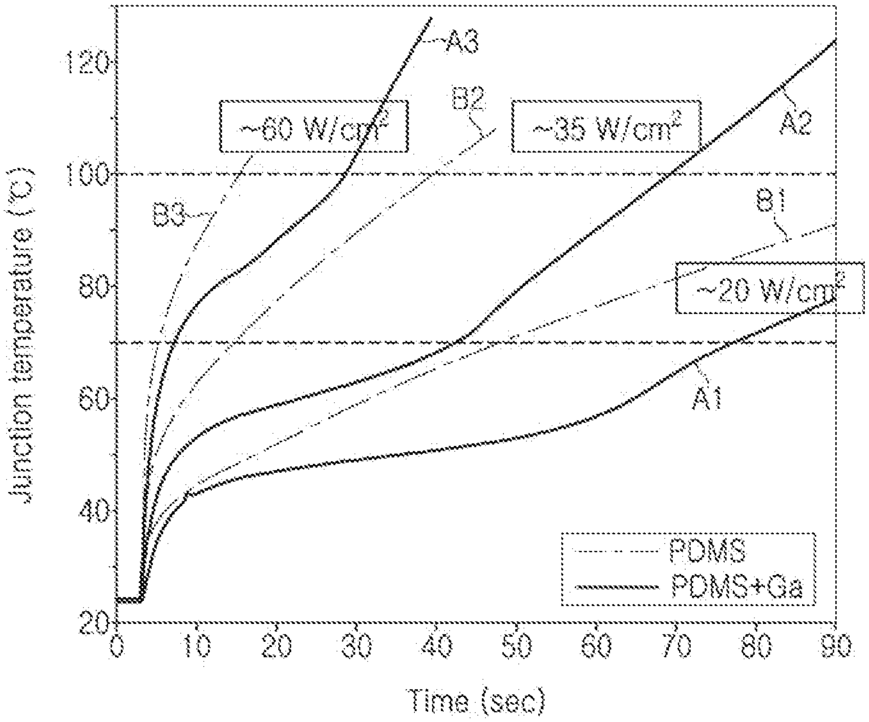
FIG. 6 is a graph illustrating a temperature change by a heat transmission medium adopted according to an example embodiment.

FIG. 6 is a graph illustrating a temperature change by a heat transmission medium adopted according to an example embodiment.

Referring to FIG. 6, in the case of the members B1, B2 and B3 formed of only the PDMS resin body, the time required to increase to 70° C. was 45.5 seconds, 11.9 seconds, and 2.3 seconds, and the time required to increase to 100° C. was 108 seconds, 37 seconds, and 12.5 seconds. In the case of the heat transfer members A1, A2 and A3 according to this example embodiment, the time required to increase to 70° C. was 74.6 seconds, 39.6 seconds, and 4.2 seconds, and the time required to increase to 100° C. was greatly improved to 122.2 seconds, 67 seconds, and 25.7 seconds. As described above, it may be confirmed that when applying the phase change metal particles, an arrival temperature time of up to 233% may be significantly improved as compared to the case in which the phase change metal particles were not applied.

Figure 7:
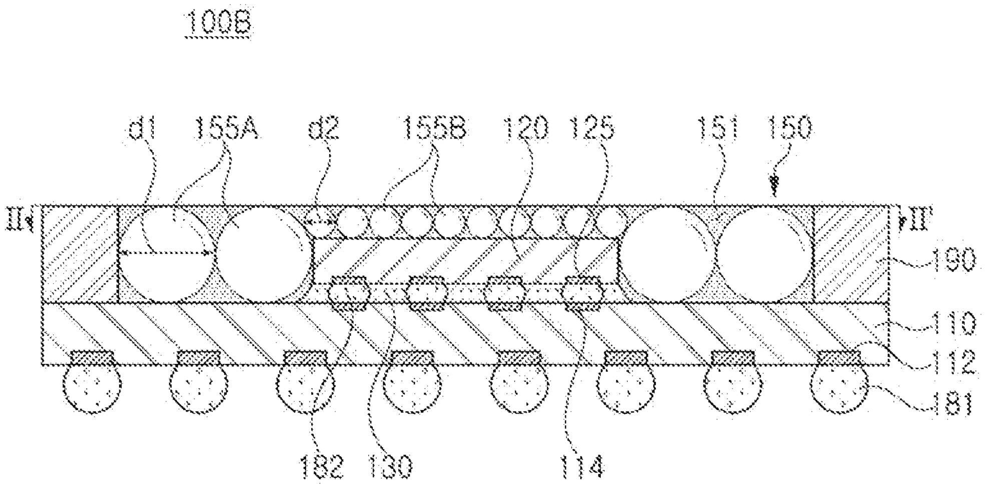
FIG. 7 is a side cross-sectional view of a semiconductor package according to an example embodiment.
Figure 8:
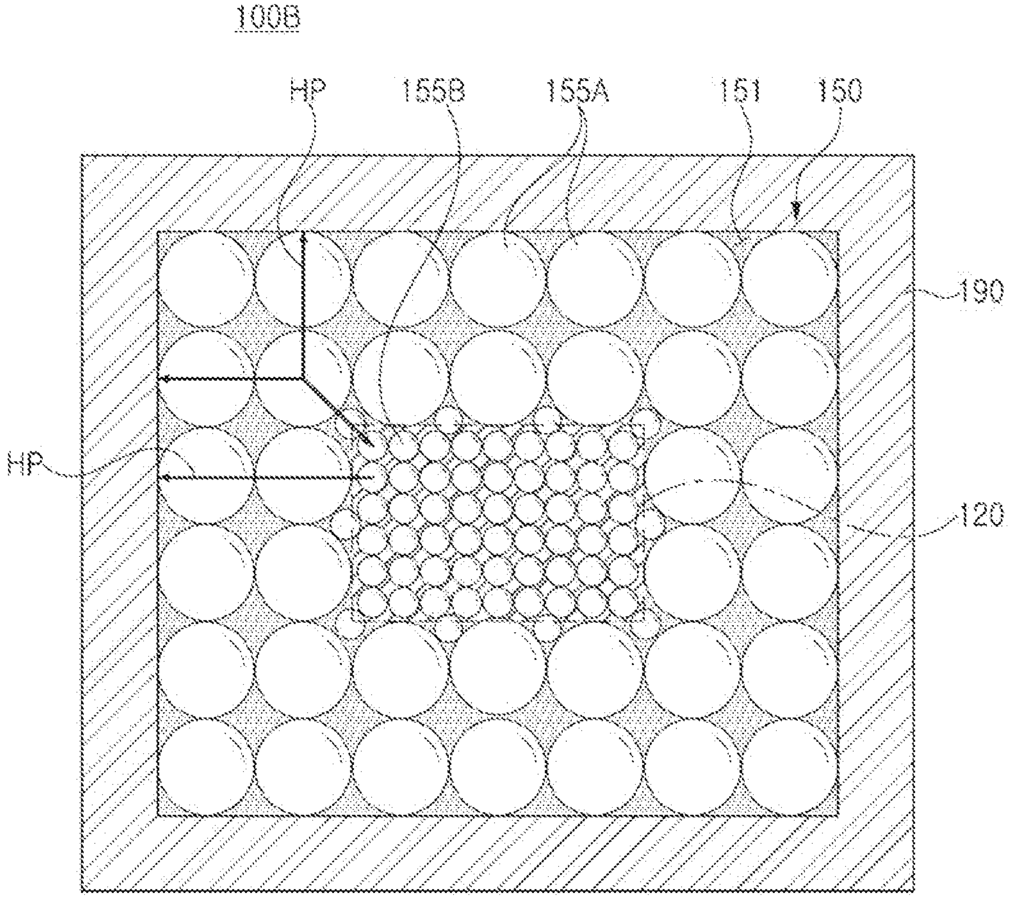
FIG. 8 is a plan view of the semiconductor package of FIG. 7 taken along line II-II'.

FIG. 7 is a side cross-sectional view of a semiconductor package according to an example embodiment, and FIG. 8 is a plan view of the semiconductor package of FIG. 7 taken along line II-II'.

Referring to FIGS. 7 and 8, a semiconductor package 100B according to an example embodiment may be understood as being similar to the semiconductor package 100 illustrated in FIGS. 1 to 3, except that semiconductor package 100B has a connection structure in which phase change metal particles 155A and 155B are two-dimensionally arranged in a resin insulating body 151, the phase change metal particles include the first and second phase change metal particles 155A and 155B having different diameters, and the heat dissipation member 190 has a different structure. The description of the components of this example embodiment may refer to the description of the same or similar components of the semiconductor package 100 illustrated in FIGS. 1 to 3 unless there described otherwise.

The heat transmission member 150 according to this example embodiment may include the resin insulating body 151 and the first and second phase change metal particles 155A and 155B arranged in two dimensions (or planes) in the resin insulating body 151. In some example embodiments, the first and second phase change metal particles 155A and 155B may be formed of the same metal or alloy, but may have different diameters d1 and d2. The phase change metal particles according to this example embodiment may include the first phase change metal particles 155A having a first diameter d1 and the second phase change metal particles 155B having a second diameter d2 smaller than the first diameter d1.

The first and second phase change metal particles 155A and 155B having different diameters may form the connection structure in the resin insulating body 151 to be in contact with a surface of the semiconductor chip 120 and an internal surface of the heat dissipation member 190, respectively. For example, the first phase change metal particles 155A may be arranged to contact the surface of the heat dissipation member 190 and the second phase change metal particles 155B may be arranged to contact the surface of the semiconductor chip 120. However, embodiments are not limited thereto, and the first and second phase change metal particles 155A and 155B may be disposed in an opposite manner. For example, the first phase change metal particles 155A may be arranged to in contact with the surface of the semiconductor chip 120, and the second phase change metal particles 155B may be arranged to in contact with the surface of the heat dissipation member 190. In other example embodiments, additional phase change metal particles having different diameters may be further included and may be additionally disposed in different subdivided regions.

As illustrated in FIG. 8, the first and second phase change metal particles 155A and 155B may be arranged in a lattice structure such that adjacent phase change metal particles 155 are be in contact with each other, thus forming a connection structure in the resin insulating body 151.

The first and second phase change metal particles 155A and 155B may be arranged to be in direct contact with each other to form a heat transmission path from the semiconductor chip 120 to the heat dissipation member 190. Through the heat transmission path, a more effective heat dispersion may be achieved, and heat transmission efficiency may be improved, thereby significantly reducing the supercooling phenomenon.

FIGS. 9A to 9D are cross-sectional views for each main process for explaining a method of manufacturing a semiconductor package according to an example embodiment, and may be understood as an example of a process of forming the heat transmission member in the semiconductor package illustrated in FIGS. 7 and 8.

Figure 9A:
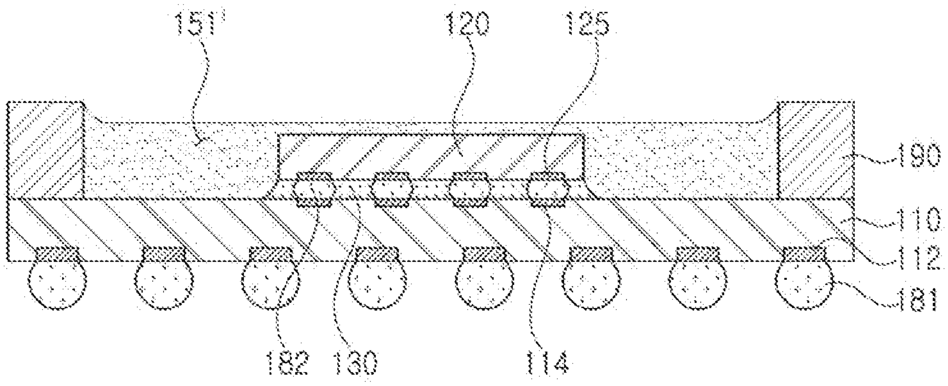
FIGS. 9A, 9B, 9C, and 9D are cross-sectional views for each process for explaining a method of manufacturing a semiconductor package according to an example embodiment.

Referring to FIG. 9A, a resin insulating body 151' may be formed to cover the semiconductor chip 120 in a region surrounded by the heat dissipation member 190. The resin insulating body 151' may be uncured or semi-cured. For example, the resin insulating body 151' may include PDMS. In an example embodiment, the process of forming the heat transmission member 150 may be performed after mounting the semiconductor chip in the circuit board 110 and forming the underfill 130.

Then, a phase change metal such as gallium for forming spherical particles may be prepared in a liquid state. Specifically, gallium metal particles may be formed by injecting a solvent (e.g., a hydrochloric acid solution) for maintaining a gallium metal at about 30° C. or higher, in a certain volume (e.g., several to tens of $\mu\ell$) using injection tools 210 and 220 such as pipettes. The first and second phase change metal particles 155A and 155B having different diameters may be formed by adjusting the volume of injected droplets.

Figure 9B:
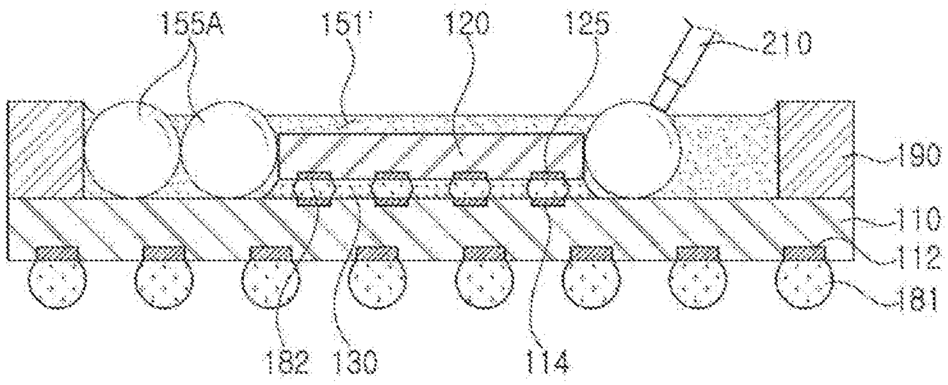

For example, referring to FIG. 9B, the prepared first injection tool 210 may be used and injected into a PDMS resin body 151' to form first phase change metal particles 155A having a first diameter. During the injection process, a solvent may be removed, and the injected gallium metal may be phase-changed to a solid state through a cooling means such as a separate cooling stage. The first phase change metal particles 155A may be disposed in a peripheral region of the semiconductor chip 120. The first phase change metal particles 155A may be first formed to directly come into contact with the heat dissipation member 190, and then, additional first phase change metal particles 155A may be formed to directly come into contact with the first formed phase change metal particles 155A.

Figure 9C:
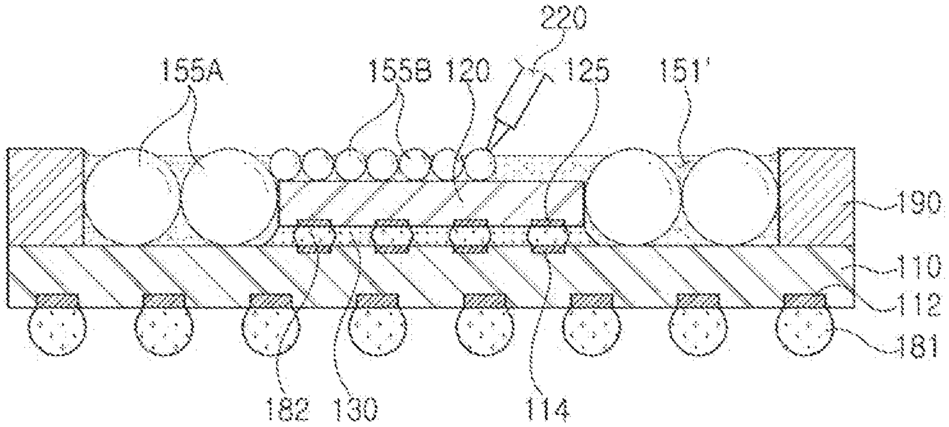

Referring to FIG. 9C, the prepared second injection tool 220 may be used and injected to a peripheral region of the semiconductor chip 120 and an upper surface thereof in the PDMS resin body 151', thus forming second phase change metal particles 155B having a second diameter. Similarly to the process of forming the first phase change metal particles 155A, the gallium metal injected by the second injection tool 220 may be phase-changed to the solid state through the cooling means such as the separate cooling stage. The second phase change metal particles 155B may be formed to be in direct contact with the first phase change metal particles 155A disposed adjacent to the semiconductor chip 120, and also, additional second phase change metal particles 155B may be formed on an upper surface of the semiconductor chip to be in direct contact with other second phase change metal particles 155B.

Figure 9D:
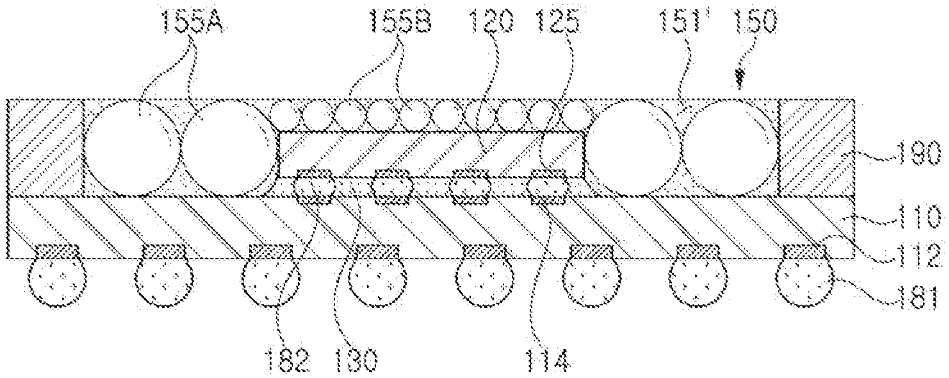

Referring to FIG. 9D, the PDMS resin body 151' may be cured while removing air bubbles from the PDMS resin body 151' using a vacuum decoder. A curing condition may be performed under a condition in which the first and second phase change metal particles 155A and 155B are maintained in the solid state. The curing process may be cured at a relatively low temperature for a relatively long time, or may be cured using other energy sources such as ultraviolet irradiation. In some example embodiments, an additional PDMS resin body may be injected into the heat dissipation member 190 to cover the first and second phase change metal particles 155A and 155B.

In an example embodiment, the process of forming the heat transmission member 150 may be performed after mounting the semiconductor chip 120 in the circuit board 110 and forming the underfill 130, but embodiments are not limited thereto, and the process thereof may be implemented by manufacturing the heat transmission member 150 through a separate process and then applying the heat transmission member 150 to a desired region of the semiconductor package 100B.

Figure 10:
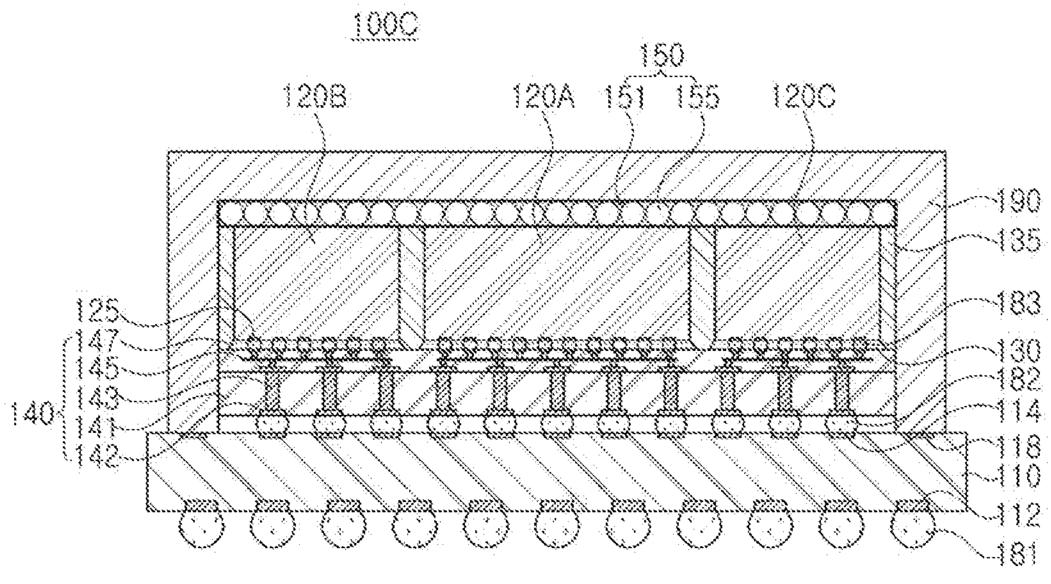
FIGS. 10 and 11 are side cross-sectional views of a semiconductor package according to various example embodiments.

FIG. 10 is a side cross-sectional view of a semiconductor package according to an example embodiment.

Referring to FIG. 10, a semiconductor package 100C according to an example embodiment may include a package substrate 110 in which an interposer 140 is mounted, and at least one first semiconductor chip 120A and second semiconductor chips 120B and 120C attached to an interposer 140. The first semiconductor chip 120A and the second semiconductor chips 120B and 120C may be mounted on the interposer 140 while being horizontally spaced apart from each other.

The interposer 140 may include a redistribution structure 145 disposed on a semiconductor substrate 141. The interposer 140 includes a lower surface and an upper surface, and lower connection terminals 142 may be arranged on the lower surface of the interposer 140 and upper connection terminals 147 may be arranged on the upper surface of the interposer 140, respectively. The upper connection terminals 147 may be electrically connected to the redistribution structure 145. In this example embodiment, the redistribution structure 145 may be connected to the lower connection terminals 142 through a through-via 143 penetrating through the semiconductor substrate 141. The interposer 140 may include the redistribution structure 145 disposed on the semiconductor substrate 141. The interposer may be replaced with a redistribution substrate or a circuit board including a silicon bridge.

Contact pads 125 of each of the first semiconductor chip 120A and the second semiconductor chips 120B and 120C may be electrically connected to the upper connection terminals 147 through connection bumps 183.

The package substrate 110 may include a wiring circuit formed in a substrate body, a plurality of lower pads 112 disposed on a lower surface of the substrate body and a plurality of upper pads 114 disposed on an upper surface of the substrate body and connected to the wiring circuit. The lower connection terminals 142 of the interposer 140 may be connected to the upper pads 114 of the package substrate 110, respectively. The package substrate 110 may be a printed circuit board provided as a main board. External connection terminals 181 may be provided on the plurality of lower pads 112 disposed on a lower surface of the package substrate 110.

The semiconductor package 100C further includes an underfill 130 disposed between the interposer 140 and the first and second semiconductor chips 120A, 120B and 120C. The underfill 130 may surround the plurality of connection bumps 183 and fill a space between the interposer 140 and the first and second semiconductor chips 120A, 120B and 120C.

The heat dissipation member 190 according to an example embodiment may have a cap structure disposed on the package substrate 110 and configured to cover the first and second semiconductor chips 120A, 120B and 120C and the interposer 140, but embodiments are not limited thereto. In this example embodiment, the heat dissipation member 190 may be connected to a conductive pattern 118 of the package substrate 110. The first semiconductor chip 120A and the second semiconductor chips 120B and 120C may be surrounded by a sealing material 135 formed on an upper surface of the interposer 140. An upper surface of the sealing material 135 may expose upper surfaces of the first semiconductor chip 120A and the second semiconductor chips 120B and 120C. The upper surfaces of the first semiconductor chip 120A and the second semiconductor chips 120B and 120C may be substantially flat with respect to the upper surface of the sealing material 135.

In an example embodiment, a heat transmission member 150 may be disposed in the space between the heat dissipation member 190 and the first and second semiconductor chips 120A, 120B and 120C. For example, the heat transmission member 150 may be a plate-shaped structure disposed on the upper surfaces of the first and second semiconductor chips 120A, 120B and 120C. After manufacturing the heat transmission member 150 in a plate-shaped structure through a separate process, the heat transmission member 150 may be disposed on the upper surfaces of the first and second semiconductor chips 120A, 120B and 120C before covering the heat transmission member 190, the heat dissipation member 190 may be disposed to be in direct contact with the heat transmission member 150.

The heat transmission member 150 according to an example embodiment may include a resin insulating body 151 and phase change metal particles 155 disposed in the resin insulating body 151. The phase change metal particles 155 may include a single metal such as gallium (Ga) or alloys. The phase change metal particles 155 in the resin insulating body 151 may form a connection structure in which they are arranged to be connected to each other. The phase change metal particles 155 may be arranged to be in direct contact with surfaces of other adjacent phase change metal particles 155. The connection structure may come into contact with the surfaces of the first and second semiconductor chips 120A, 120B and 120C and the internal surface of the heat dissipation member 190, respectively. Through the contact of the phase change metal particles 155, the connection structure of the phase change metal particles 155 may form a heat transmission path for transmitting heat generated by the first and second semiconductor chips 120A, 120B and 120C to the heat dissipation member 190.

Figure 11:
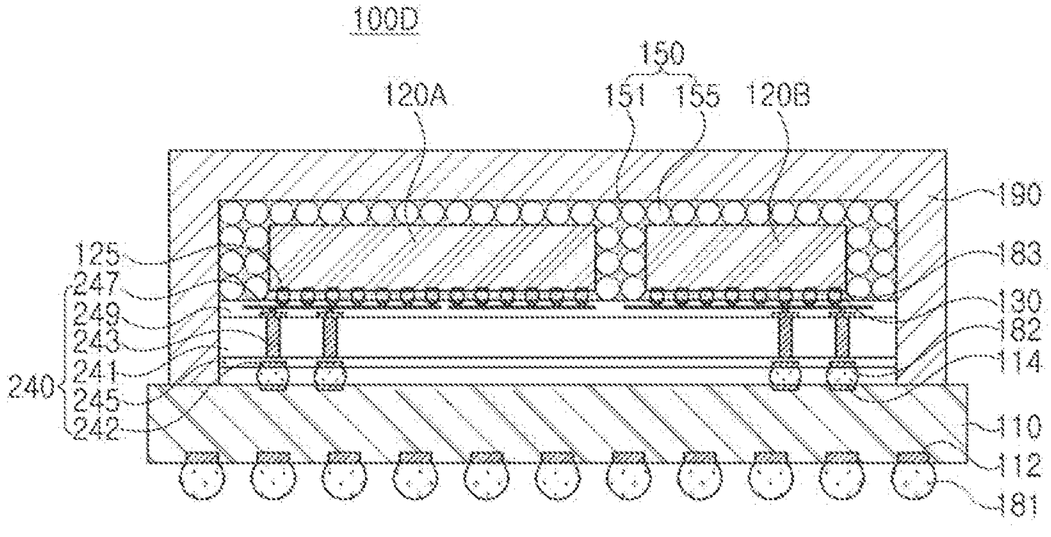

FIG. 11 is a side cross-sectional view of a semiconductor package according to an example embodiment.

Referring to FIG. 11, a semiconductor package 100D according to an example embodiment includes a package substrate 110 and a chip stack mounted on the package substrate 110. The chip stack according to this example embodiment may include a lower semiconductor chip 240 having a relatively large area and a first upper semiconductor chip 120A and a second upper semiconductor chip 120B disposed on the lower semiconductor chip 240. The first and second upper semiconductor chips 120A and 120B may be mounted on the lower semiconductor chip 240 in a state in which they are horizontally spaced apart from each other.

The lower semiconductor chip 240 may be a logic chip, and at least one of the first and second upper semiconductor chips 120A and 120B may be a memory chip. For example, the logic chip may include a controller or a microprocessor. The memory chips, for example, may include memory chips such as a DRAM, an SRAM, a flash, a PRAM, an ReRAM, a FeRAM, or am MRAM. In some example embodiments, the memory chip may be an HBM chip made up of stacks of the memory chip connected to each other in a TSV structure.

The lower semiconductor chip 240 may include a redistribution layer 249 disposed on an upper surface of the semiconductor substrate 241, and a device layer 245 disposed on a lower surface (i.e., an active surface) of the semiconductor substrate 241. Lower connection terminals 242 and upper connection terminals 247 may be arranged on a lower surface and an upper surface of the lower semiconductor chip 240, respectively. The contact pads 125 of each of the first and second upper semiconductor chips 120A and 120B may be electrically connected to upper connection terminals 247 through connection bumps 183. The lower semiconductor chip 240 includes a through-via 243 penetrating through the semiconductor substrate 241. The first and second upper semiconductor chips 120A and 120B connected to the upper connection terminals 247 may be connected to the device layer 245 or the lower connection terminal 242 through the through-via 243.

The package substrate 110 may include a wiring circuit formed in a substrate body, a plurality of lower pads 112 disposed on a lower surface of the substrate body and a plurality of upper pads 114 disposed on an upper surface of the substrate body and connected to the wiring circuit. The lower connection terminals 242 of the lower semiconductor chip 240 may be connected to the upper pads 114 of the package substrate 110, respectively, through the connection bumps 182. For example, the package substrate 110 may be a printed circuit board provided as a main board. External connection terminals 181 may be provided on the plurality of lower pads 112 disposed on the lower surface of the package substrate 110.

The semiconductor package 100C further includes an underfill 130 disposed between the lower semiconductor chip 240 and the first and second upper semiconductor chips 120A and 120B. The underfill 130 may surround the plurality of connection bumps 183 and fill a space between the lower semiconductor chip 240 and the first and second upper semiconductor chips 120A and 120B.

Similarly to the previous example embodiment illustrated in FIG. 10, a heat dissipation member 190 according to an example embodiment may have a cap structure disposed on the package substrate 110 and configured to cover chip stacks of the lower semiconductor chip 240 and the first and second upper semiconductor chips 120A and 120B, but embodiments are not limited thereto. In an example embodiment, a heat transmission member 150 according to this example embodiment may be disposed in a space between the chip stacks 120A, 120B and 240 and the heat dissipation member 190. As illustrated in FIG. 11, the heat transmission member 150 may be disposed on the first semiconductor chip 240 to surround the first and second upper semiconductor chips 120A and 120B. The heat transmission member 150 may be in direct contact with a partial upper surface of the lower semiconductor chip 240 and upper surfaces and side surfaces of the first and second upper semiconductor chips 120A and 120B, and may provide a heat transmission path to the heat dissipation member 190 using the phase change metal particles.

For example, the heat transmission member 150 may include a resin insulating body 151 and phase change metal particles 155 disposed in the resin insulating body 151. The phase change metal particles 155 may include a single metal such as gallium (Ga) or alloys. The phase change metal particles 155 in the resin insulating body 151 may form a connection structure in which they are arranged to be connected to each other. The phase change metal particles 155 may be arranged to be in direct contact with surfaces of other adjacent phase change metal particles 155. The connection structure may come into contact with the lower semiconductor chip 240, the first and second upper semiconductor chips 120A and 120B, and the internal surface of the heat dissipation member 190, respectively.

According to the present disclosure, the connection structure of the phase change metal particles 155 may form a heat transmission path for transmitting the heat generated by the semiconductor chip 120 to the heat dissipation member 190 through the contacts of the phase change metal particles 155. During the heat transmission process, even after changing the phase change metal particles 150 to the liquid phase, the unclear formation may be performed at the portion in contact with the heat dissipation member 190, and accordingly, the phase change metal particles 150 may be changed back to the solid phase. Accordingly, the heat transmission process may significantly reduce the supercooling phenomenon and improve heat transmission efficiency.

According to example embodiments, a heat transmission member (or a heat dissipation member) disposed in a matrix, which is an insulating resin (e.g., a polymer such as PDMS), may be provided to particles formed of metal-based phase change materials (also known as "phase change metal particles"), which may be applied directly to a semiconductor chip that is a heat source. In an insulating matrix, the phase change metal particles may form a connection structure in which they are arranged to be connected to each other. The connection structure may form a transmission path of heat emitted by the semiconductor chip, and metal particles changed into a liquid phase come into may come contact with other metal particles (e.g., solid), which may promote nuclear formation at an interface to effectively prevent supercooling.

The present disclosure is not limited to the example embodiment described above and the accompanying drawings. The scope of rights of the present disclosure is intended to be limited by the appended claims and their equivalents. Therefore, those of ordinary skill in the art may make various replacements, modifications, or changes without departing from the scope of the present disclosure defined by the appended claims and their equivalents, and these replacements, modifications, or changes should be construed as being included in the scope of the present disclosure.

What is claimed is:

1. A semiconductor package comprising:
a circuit board;
a semiconductor chip on the circuit board;
a heat dissipation member adjacent to the semiconductor chip; and
a heat transmission member between the semiconductor chip and the heat dissipation member, the heat transmission member comprising a resin insulating body and phase change metal particles connected to each other in the resin insulating body,
wherein the phase change metal particles connect the semiconductor chip and the heat dissipation member, the phase change metal particles being configured to transmit heat generated by the semiconductor chip to the heat dissipation member,
wherein the phase change metal particles comprise first phase change metal particles having a first diameter and second phase change metal particles having a second diameter that is smaller than the first diameter, and
wherein the first phase change metal particles are in contact with a surface of the heat dissipation member, and the second phase change metal particles are in contact with a surface of the semiconductor chip.

2. The semiconductor package of claim 1, wherein the phase change metal particles comprise gallium (Ga), or alloys of indium (In), bismuth (Bi) and tin (Sn).

3. The semiconductor package of claim 1, wherein the phase change metal particles have a spherical shape, and
wherein the semiconductor package further comprises a shell surrounding each of the phase change metal particles.

4. The semiconductor package of claim 3, wherein the shell comprises an oxide film or polyvinylidene fluoride (PVDF).

5. The semiconductor package of claim 1, wherein each of the phase change metal particles has a same diameter.

6. The semiconductor package of claim 1, wherein the heat dissipation member comprises a first heat dissipation member on a package substrate, an interposer and the plurality of semiconductor chips, and a second heat dissipation member on the first heat dissipation member, the second heat dissipation member being a heat sink.

7. The semiconductor package of claim 1, wherein each of the phase change metal particles comprises two or more layers.

8. The semiconductor package of claim 1, wherein a melting point of the phase change metal particles is greater than or equal to 20° C.

9. The semiconductor package of claim 1, wherein a thermal conductivity of the phase change metal particles is greater than or equal to 20 W/m·K.

10. The semiconductor package of claim 1, wherein a diameter of each of the phase change metal particles ranges from 0.1 mm to 5 mm.

11. The semiconductor package of claim 1, wherein the resin insulating body comprises one of polydimethylsiloxane (PDMS), polyimide (PI), polyethylene terephthalate (PET), polyethersulfone (PES), polyethylene naphthalate (PEN), polyaniline (PA), an epoxy resin, and an acrylic resin.

12. The semiconductor package of claim 1, wherein a volume percent of a volume the phase change metal particles with respect to a volume of the heat transmission member is in a range of 50 vol % to 90 vol %.

13. The semiconductor package of claim 1, wherein the heat transmission member is adjacent to an upper surface of the semiconductor chip and a side surface of the semiconductor chip.

14. The semiconductor package of claim 1, wherein the heat dissipation member is adjacent to an upper surface of the semiconductor chip and a side surface of the heat transmission member.

15. A semiconductor package comprising:

an interposer comprising a first surface and a second surface opposite to the first surface, the interposer comprising upper connection terminals on the first surface and lower connection terminals on the second surface;

a plurality of semiconductor chips on the interposer and connected to the upper connection terminals;

a package substrate on which the interposer is mounted to be connected to the lower connection terminals;

a heat dissipation member on the package substrate, the interposer, and the plurality of semiconductor chips; and a heat transmission member between the plurality of semiconductor chips and the heat dissipation member, the heat transmission member comprising a resin insulating body and phase change metal particles connected to each other in the resin insulating body, wherein the phase change metal particles comprise first phase change metal particles in contact with a surface of each of the plurality of semiconductor chips and second phase change metal particles in contact with a surface of the heat dissipation member, the phase change metal particles being configured to transmit heat generated by each of the plurality of semiconductor chips to the heat dissipation member, wherein a first diameter of the first phase change metal particles is less than a second diameter of the second phase change metal particles.

16. The semiconductor package of claim 15, wherein the phase change metal particles comprise metal particles of different sizes.

17. The semiconductor package of claim 15, wherein the resin insulating body comprises one of polydimethylsiloxane, polyimide, polyethylene terephthalate, polyethersulfone, polyethylene naphthalate, polyaniline, an epoxy resin, and an acrylic resin, and wherein the phase change metal particles comprise gallium (Ga), or alloys of indium (In), bismuth (Bi) and tin (Sn).

18. The semiconductor package of claim 15, wherein a melting point of the phase change metal particles is greater than or equal to 20° C., and wherein a thermal conductivity of the phase change metal particles is greater than or equal to 20 W/m·K.

19. A semiconductor package comprising:

a circuit board;

a semiconductor chip on the circuit board; and a heat dissipation member comprising a resin insulating body adjacent to the semiconductor chip and phase change metal particles connected to each other in the resin insulating body, wherein the phase change metal particles comprise first phase change metal particles in contact with a surface of the semiconductor chip and second phase change metal particles in contact with a surface of the heat dissipation member, the phase change metal particles configured to transmit heat generated by the semiconductor chip to the heat dissipation member, wherein a first diameter of the first phase change metal particles is less than a second diameter of the second phase change metal particles.

* * * * *